United States Patent
Ganesan et al.

(10) Patent No.: US 8,513,792 B2
(45) Date of Patent: Aug. 20, 2013

(54) PACKAGE-ON-PACKAGE INTERCONNECT STIFFENER

(75) Inventors: Sanka Ganesan, Chandler, AZ (US); Yosuke Kanaoka, Ibaraki (JP); Ram S. Viswanath, Phoenix, AZ (US); Rajasekaran Swaminathan, Tempe, AZ (US); Robert M. Nickerson, Chandler, AZ (US); Leonel R. Arana, Phoenix, AZ (US); John S. Guzek, Chandler, AZ (US); Yoshihiro Tomita, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 12/384,984

(22) Filed: Apr. 10, 2009

(65) Prior Publication Data
US 2010/0258927 A1    Oct. 14, 2010

(51) Int. Cl.
*H01L 23/02* (2006.01)
*H01L 23/34* (2006.01)
*H01L 23/48* (2006.01)
*H01L 23/52* (2006.01)
*H01L 29/40* (2006.01)

(52) U.S. Cl.
USPC ........... 257/686; 257/723; 257/773; 257/777; 257/E25.013; 257/E23.085

(58) Field of Classification Search
USPC .......... 257/686, 723, 777, E25.006, E25.013, 257/E25.018, E25.021, E25.027, E23.085, 257/E21.614, 737, 738, 773
See application file for complete search history.

(56) References Cited

U.S. PATENT DOCUMENTS

| | | | | |
|---|---|---|---|---|
| 5,977,640 | A * | 11/1999 | Bertin et al. | 257/777 |
| 6,224,711 | B1 * | 5/2001 | Carden et al. | 156/311 |
| 6,333,857 | B1 * | 12/2001 | Kanbe et al. | 361/792 |
| 6,493,240 | B2 * | 12/2002 | Broglia et al. | 361/803 |
| 6,545,353 | B2 * | 4/2003 | Mashino | 257/724 |
| 7,078,788 | B2 * | 7/2006 | Vu et al. | 257/668 |
| 7,459,782 | B1 * | 12/2008 | Li | 257/702 |
| 2002/0159243 | A1 * | 10/2002 | Ogawa et al. | 361/760 |
| 2003/0000083 | A1 * | 1/2003 | Takahashi | 29/847 |
| 2003/0102547 | A1 * | 6/2003 | Higashi et al. | 257/686 |
| 2004/0107569 | A1 * | 6/2004 | Guzek et al. | 29/846 |
| 2004/0150118 | A1 * | 8/2004 | Honda | 257/778 |
| 2005/0121761 | A1 * | 6/2005 | Maeda et al. | 257/678 |
| 2005/0230835 | A1 * | 10/2005 | Sunohara et al. | 257/758 |

(Continued)

FOREIGN PATENT DOCUMENTS

| | | | | |
|---|---|---|---|---|
| JP | 2005217201 | A | * | 8/2005 |
| JP | 2006024842 | A | * | 1/2006 |

*Primary Examiner* — Teresa M Arroyo
(74) *Attorney, Agent, or Firm* — Blakely, Sokoloff, Taylor & Zafman LLP (57) ABSTRACT

Embodiments of the invention relate to a package-on-package (PoP) assembly comprising a top device package and a bottom device package interconnected by way of an electrically interconnected planar stiffener. Embodiments of the invention include a first semiconductor package having a plurality of inter-package contact pads and a plurality of second level interconnect (SLI) pads; a second semiconductor package having a plurality of SLI pads on the bottom side of the package; and a planar stiffener having a first plurality of planar contact pads on the top side of the stiffener electrically connected to the SLI pads of the second package, and a second plurality of planar contact pads electrically connected to the inter-package contact pads of the first package.

18 Claims, 5 Drawing Sheets

(56) References Cited

U.S. PATENT DOCUMENTS

| | | | |
|---|---|---|---|
| 2006/0077644 A1* | 4/2006 | Nickerson et al. | 361/767 |
| 2006/0099803 A1* | 5/2006 | Min | 438/643 |
| 2006/0175695 A1* | 8/2006 | Lee | 257/686 |
| 2007/0001277 A1* | 1/2007 | Ichikawa | 257/676 |
| 2007/0266886 A1* | 11/2007 | En et al. | 106/1.18 |
| 2008/0061437 A1* | 3/2008 | Kohara et al. | 257/738 |
| 2008/0113502 A1* | 5/2008 | Low et al. | 438/612 |
| 2008/0142940 A1* | 6/2008 | Dunne | 257/686 |
| 2008/0157326 A1* | 7/2008 | Han et al. | 257/686 |
| 2008/0185719 A1* | 8/2008 | Cablao et al. | 257/738 |
| 2009/0014859 A1* | 1/2009 | Jeung et al. | 257/686 |
| 2010/0078786 A1* | 4/2010 | Maeda | 257/678 |

\* cited by examiner

PACKAGE-ON-PACKAGE INTERCONNECT STIFFENER

FIELD

Embodiments of the invention relate to semiconductor packaging technology. More particularly, embodiments of the invention relate to a package-on-package interconnect stiffener.

BACKGROUND

Mobile devices such as mobile phones, mobile internet devices (MIDs) and laptops, are designed with smaller form factor and slimmer profile for improved aesthetic and functional appeals. The size of and real estate occupied by semiconductor packages in the devices need to be scaled down accordingly. Package-on-package (PoP) packaging technology is employed to stack a semiconductor package on top of another semiconductor package to remove the x and y dimensions constraints in the layout of semiconductor packages on a motherboard.

Figure 1:
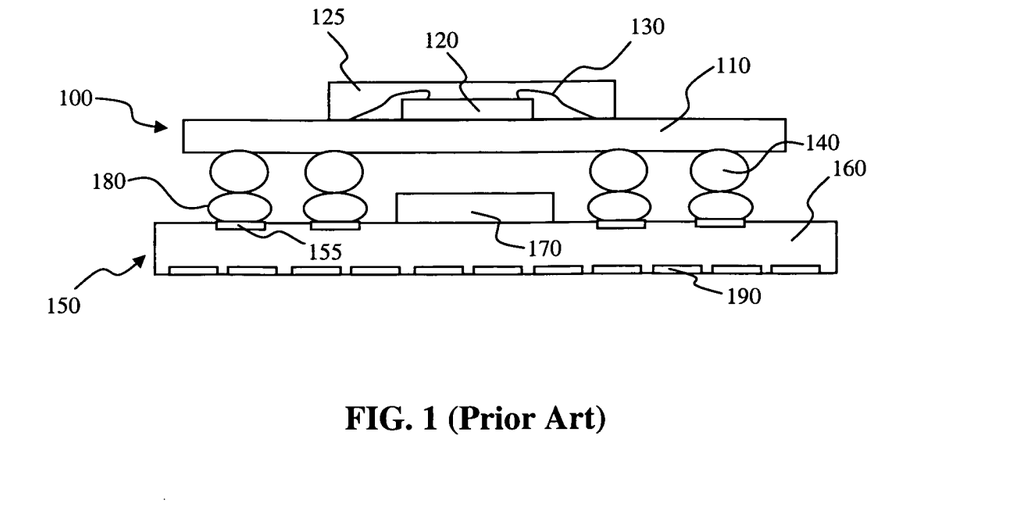
FIG. 1 is a cross-sectional view of a known package-on-package (PoP) assembly.

PoP technology presents various problems, particularly with respect to the original equipment manufacturer (OEM) process. One of the problems is the limitation of cold surface to cold surface solder reflow process. FIG. 1 is a cross-sectional view of a known package-on-package (PoP) assembly. Bottom device package 150 may be a core chip such as a microprocessor unit and includes die 170, substrate 160, inter-package contact pads 155 on the top side of bottom package 150, micro balls 180 attached to inter-package contact pads 155, and second level interconnect pads 190 attachable to a motherboard (not shown). Top device package 100 is stacked onto bottom package 150 to form an electrical connection therebetween. Top device package 100 may be a peripheral chip such as a memory or cache unit, and may include die 120 interconnected to substrate 110 via wire bond 130 and encapsulated by molding 125. The bottom side of top device package 100 includes micro balls 140 reflowed and electrically connected to micro balls 180 on the top side of bottom device package 150. During the OEM process, accurate placement and reflow of top device package 100 on bottom device package 150 are typically limited and difficult to control due to the curved surfaces of micro balls 140, 180 and result in poor stacking yield. Further, the pitch of micro balls 140 of top device package 100 is limited by the pitch of micro balls 180 of bottom device package 150. A change in the ball pitch of top device package 100 necessitates a change in the ball pitch of the bottom device package 150 and vice versa.

Another problem typically associated with PoP packaging is the coefficient of thermal expansion (CTE) mismatch between top device package 100 and bottom device package 150. The CTE mismatch is due to the fact that top device package 100 and bottom device package 150 are made from different materials and undergo different rates of thermal expansion in an elevated temperature range. The different rates of expansion and contraction result in warpage of the PoP assembly. Warpage of the PoP assembly presents process challenges in the package stacking process step and quality of joint formation between top device package 100 and bottom device package 150. Intrinsic stresses accumulated in the solder joints between the packages may risk quality and reliability failures during the use of the device.

BRIEF DESCRIPTION OF THE DRAWINGS

Embodiments of the invention are illustrated by way of example and not limited in the figures of the accompanying drawings, in which like references indicate similar elements.

DETAILED DESCRIPTION

Embodiments of the invention relate to a package-on-package (PoP) assembly comprising a top device package and a bottom device package interconnected by way of an electrically interconnected planar stiffener. Embodiments include a planar stiffener having contact pads on the bottom side attached to a bottom device package, and contact pads on the top side of the stiffener to receive a top device package. Embodiments of the invention include a first semiconductor package having a plurality of inter-package contact pads and a plurality of second level interconnect (SLI) pads; a second semiconductor package having a plurality of SLI pads on the bottom side of the package; and a planar stiffener having a first plurality of planar contact pads on the top side of the stiffener electrically connected to the SLI pads of the second package, and a second plurality of planar contact pads electrically connected to the inter-package contact pads of the first package. Embodiments of the invention provide reliable electrical interconnection and warpage control between the top device package and the bottom device package.

Figure 2:
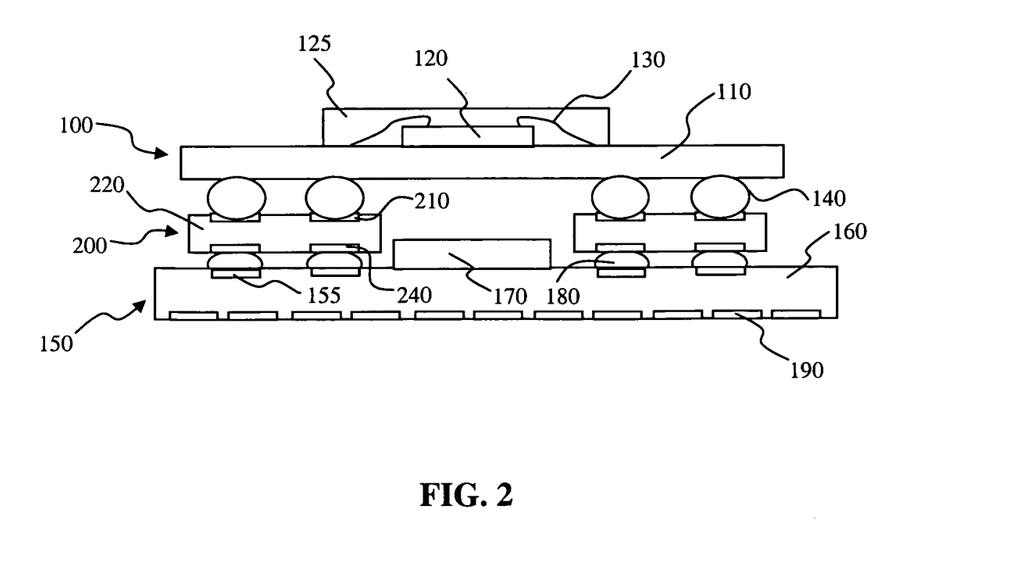
FIG. 2 is a cross-sectional view of a package-on-package (PoP) assembly having an interconnect stiffener according to an embodiment.

FIG. 2 is a cross-sectional view of a package-on-package (PoP) assembly having an interconnect stiffener according to an embodiment. The PoP assembly is attachable to a motherboard (not shown) via second level interconnect pads 190 disposed on the bottom side of bottom device package 150. The PoP assembly includes bottom device package 150 interconnected to planar interconnect stiffener 200. Bottom device package 150 may be any semiconductor package depending on the application. For example, bottom device package 150 may be a semiconductor logic package, an application processor, or a memory package with an integrated circuit in die 170. Planar stiffener 200 includes a plurality of planar contact pads 210 disposed on the top side of stiffener 200. Planar contact pads 210 are configured to be electrically connected to top device package 100, for example, by way of micro balls 140. Top device package 100 may be a memory package or cache unit or any other device package suited for connection with the type of device of bottom device package 150. Planar stiffener 200 also includes a plurality of planar contact pads 240 disposed on the bottom side of stiffener 200. In the PoP assembly, planar contact pads 240 are electrically connected to bottom device package 150, for example, by way of micro balls 180.

Figure 3:
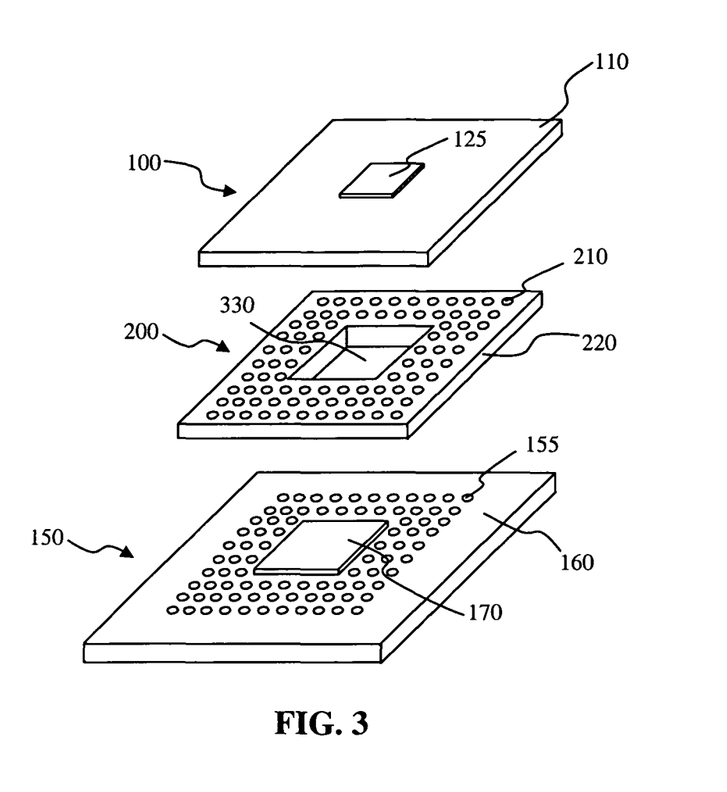
FIG. 3 is an exploded perspective view of a PoP assembly having an interconnect stiffener according to an embodiment.

FIG. 3 is an exploded perspective view of a PoP assembly having an interconnect stiffener according to an embodiment. Planar interconnect stiffener 200 includes substrate 220 defining a through recess 330 adapted to house die 170 of bottom device package 150. Stiffener 200 also includes small through openings through which planar contact pads 210 and 240 are formed. Planar contact pads 210 and 240 formed on substrate 220 each includes a solder-wettable surface finish so that during reflow, the solder materials of micro balls 140 and 180 can melt, wet and form permanent conductive connection between stiffener 200 and the top and bottom packages 100, 150. Various types of solder-wettable surface finish known in the art such as Electroless Nickel/Immersion Gold (ENIG), ENIG+Electroless Gold (ENIG+EG) and Nickel-Palladium-Gold (NiPdAu) are suitable for planar contact pads 210 and 240.

Figure 4:
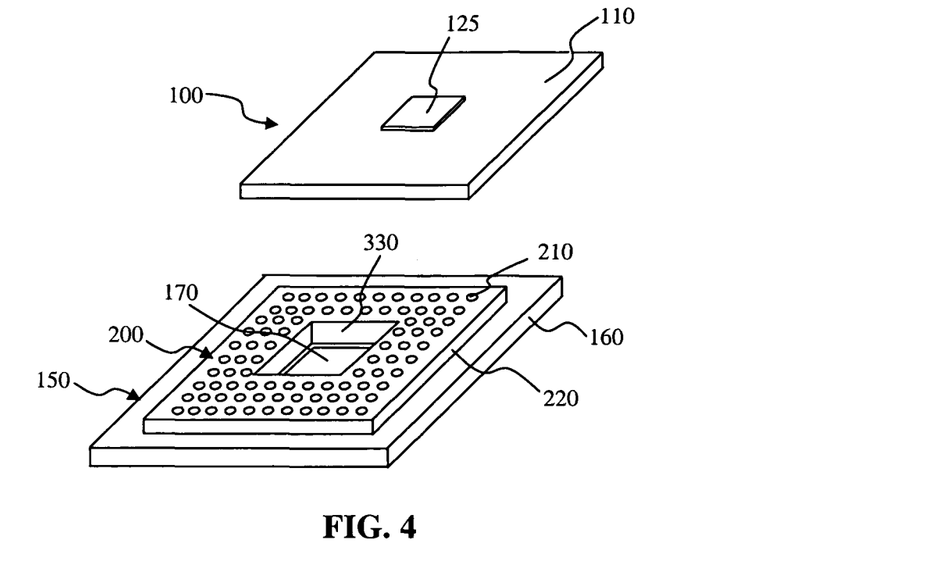
FIG. 4 is an exploded perspective view of a top device package and a bottom device package having an interconnect stiffener attached to the top side of the bottom device package according to an embodiment.

FIG. 4 is an exploded perspective view of a top device package and a bottom device package having an interconnect stiffener attached to the top side of the bottom device package according to an embodiment. Stiffener 220 is attached to bottom device package 150 via respective contact pads 155 and 240. Planar contact pads 240 disposed on the bottom side of stiffener 220 are connected to inter-package contact pads 155 of bottom device package 150 by way of conductive micro balls 180. Stiffener 220 may be attached to bottom device package 150 before attaching top device package 100 to the top side of stiffener 220. The layout of planar contact pads 240 on the bottom side of stiffener 220 may match the layout of inter-package contact pads 155 of bottom device package 150. However, the layout of planar contact pads 240 on the bottom side of stiffener 220 is not precluded to be different from the layout of planar contact pads 210 on the top side of stiffener 220.

Figure 5:
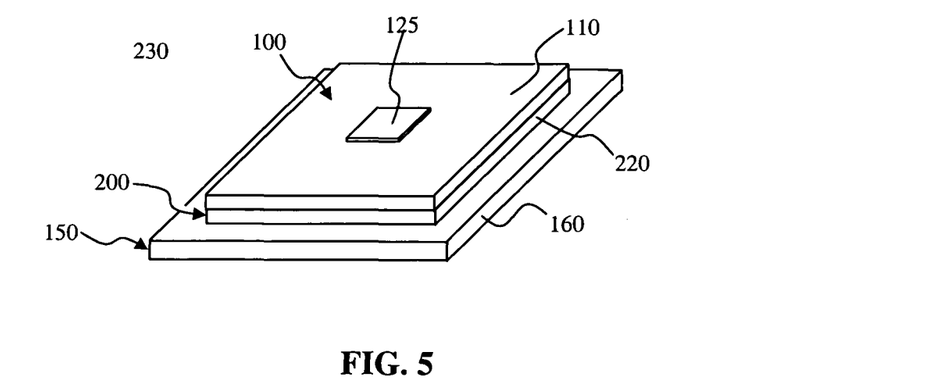
FIG. 5 is a perspective view of an assembled PoP assembly having a top device package and a bottom device package attached to an interconnect stiffener according to an embodiment.

FIG. 5 is a perspective view of an assembled PoP assembly having a top device package and a bottom device package attached to an interconnect stiffener according to an embodiment. Top device package 100 is connected to stiffener 220 via interconnects such as micro balls 140 disposed on planar contact pads 210 on the top side of stiffener 220. FIG. 5 shows an embodiment of assembled PoP with the width and length dimensions of top device package 100 substantially the same with the respective dimensions of stiffener 220. However, stiffener 220 is not precluded to have other dimensions relative to top device package 100 and bottom device package 150.

Figure 6:
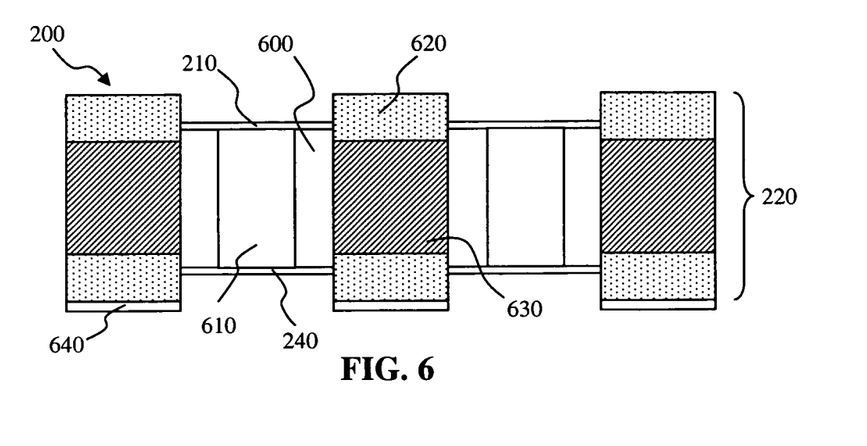
FIG. 6 is a cross-sectional view of a PoP interconnect stiffener according to an embodiment.

FIG. 6 is a cross-sectional view of a PoP interconnect stiffener according to an embodiment. Stiffener 200 includes substrate 220 to provide structural support and upon which contact pads 210, 240 are fabricated. Stiffener 200 includes solder resist layer 620 disposed on the top surface and bottom surface of core layer 630. For an embodiment, core layer 630 is a cored substrate fabricated from known polymeric materials such as bismaleimide triazine (BT), polyimide, and liquid crystalline (LC) polymer. However, other materials suitable for core layer 630 are not precluded in other embodiments of the invention. Substrate 220 may include a coefficient of thermal expansion (CTE) of approximately between 15 and 25 ppm. Substrate 220 may also include a flexural modulus of approximately between 15 and 30 GPa. The properties of stiffener 200 will be designed to provide acceptable end-of-line warpage of the assembly of top device package 100 and stiffener 200 and/or the reliability of the interconnections between top device package 100 and stiffener 200.

Stiffener 200 also includes conductive traces 600 fabricated in substrate 220 to electrically interconnect planar contact pads 210 on the top side of stiffener 220 with planar contact pads 240 on the bottom side of stiffener 220. FIG. 6 illustrates a via-in-pad design in which plug material 610 is disposed between core layer 630 and between planar contact pads 210, 240. Plug material 610 forms part of the material for substrate 220 to provide structural rigidity and foundation to contact pads 210 and 240 and is made from known materials such as silica filled epoxy composite or commercially available solder resist materials. Stiffener 220 may also include routing features accommodating various circuitry designs of top device package 100. Hence, the circuitry laid in substrate 160 of bottom device package 150 needs not be redesigned every time when top device package 100 of different circuitry layout is paired with bottom device package 150. Stiffener 200 may include adhesive 640 laminated on solder resist layer 620 on the bottom side of stiffener 200 to adhere stiffener 200 to the top surface of bottom device package 150. Adhesive 640 may be any type of known adhesive having a low glass transition temperature ($T_g$), for example between 90 and 180° C., such that adhesive 640 is cured below the typical solder reflow temperature range of 220-260° C.

Figure 7:
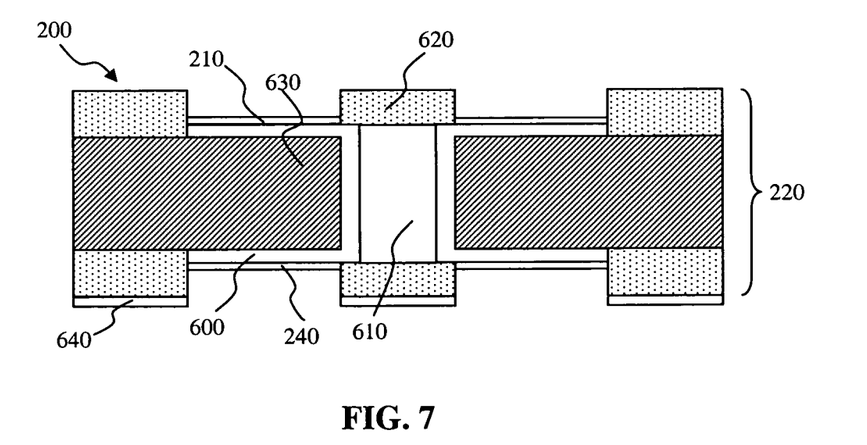
FIG. 7 is a cross-sectional view of a PoP interconnect stiffener according to another embodiment.

FIG. 7 is a cross-sectional view of a PoP interconnect stiffener according to another embodiment. FIG. 7 embodies a via-off-pad design in which core layer 630 extends in planar contact pads 210 and 240 regions, and plug material 610 is disposed between solder resist layers 520 and in substrate 220. Other designs of substrate 220 are not in precluded in other embodiments of the invention.

Figure 8:
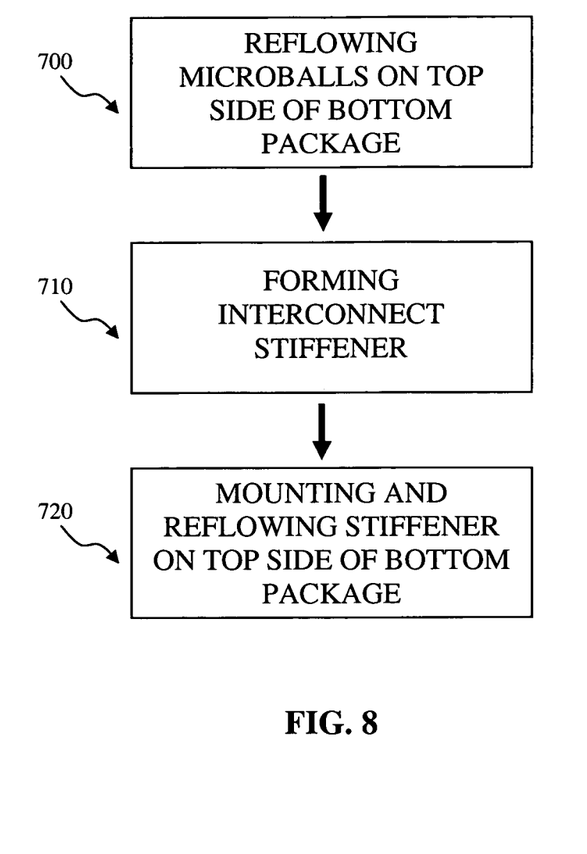
FIG. 8 is a flowchart of a method of fabricating a PoP assembly having an interconnect stiffener according to an embodiment.

FIG. 8 is a flowchart of a method of fabricating a PoP assembly having an interconnect stiffener according to an embodiment. Bottom device package 150 having inter-package contact pads 155 on the top side of the package and second level interconnect (SLI) pads 190 on the bottom side of the package is provided. Bottom device package 150 may be in the form of individual package or multiple packages connected in a panel form. In operation 700, micro balls 180 are placed on inter-package contact pads 155 of bottom device package 150 and reflowed to form solder interconnection. In operation 710, planar stiffener 200 is fabricated from core layer 630 material. Stiffener 200 may be formed in a panel form from which individual stiffener 200 units may be obtained after singulation. Known process to fabricate package substrate may be used to form stiffener 200 and the key process steps may include: drilling through-holes in core layer 630; plating the sidewalls of through-holes; disposing plug material 610 in the through-holes; forming electrically conductive planar contact pads 210 and 240; forming a solder-wettable finish on planar contact pads 210 and 240; and forming recess 330 in stiffener 200.

In operation 720 (FIG. 8), planar stiffener 200 is mounted on the top side of bottom device package 150. Planar contact pads 240 on the bottom side of stiffener 200 are aligned and attached to micro balls 180 connected to inter-package contact pads 155 of bottom device package 150. The assembly of stiffener 200 and bottom device package 150 are reflowed to form permanent interconnection. After reflow, die 170 is attached to bottom device package 150 attached to stiffener 200. The assembly of bottom device package 150 and stiffener 200 (in panel form) may then be singulated to yield individual assemblies of bottom device package 150 with stiffener 200 attached thereto. Top device package 100 may subsequently be attached to planar contact pads 210 on the top side of stiffener 200 to form a package-on-package assembly.

Embodiments of the invention provide a device package electrically interconnected with an interconnect stiffener upon which another device package can be mounted and electrically connected to form a package-on-package assembly. The stiffener in the package-on-package assembly provides the necessary stiffness to the assembly for improved warpage control and the platform on which a top device package can be attached with greater process control.

In the foregoing specification, reference has been made to specific embodiments of the invention. It will, however be evident that various modifications and changes may be made thereto without departing from the broader spirit and scope of the invention. The specification and drawings are, accordingly, to be regarded in an illustrative rather than restrictive sense.

What is claimed is:

1. A semiconductor assembly, comprising:
a first semiconductor package having a plurality of inter-package contact pads on a top side and a plurality of second level interconnect (SLI) pads on a bottom side; and
a planar stiffener having a first plurality of planar contact pads on a top side of the stiffener electrically connected to a second semiconductor package, and a second plurality of planar contact pads on a bottom side of the stiffener electrically connected to the inter-package contact pads of the first semiconductor package by a solder having a melt temperature wherein said stiffener has an adhesive on the bottom side of the stiffener which attaches said stiffener to the top side of the first semiconductor package, said adhesive having a glass transition temperature between 90° C.-180° C. and a cure temperature below said melt temperature;
wherein said planar stiffener has a substrate comprising a polymeric core and an insulative plug material.

2. The assembly of claim 1, wherein the stiffener comprises:
said substrate having a through recess adapted to house a die electrically attached to the first package, and a plurality of through openings through which the first and second pluralities of contact pads are disposed;
a solder-wettable planar surface finish on the first and second pluralities of contact pads; and
a conductive trace electrically interconnecting the first plurality of contact pads to the corresponding second plurality of contact pads.

3. The assembly of claim 1, wherein the stiffener includes routing features located on said top side of said stiffener and connected to said first plurality of contact pads.

4. The assembly of claim 1, wherein the second plurality of contact pads of the stiffener is connected to the first package by way of conductive micro balls comprising said solder.

5. The assembly of claim 2, wherein the substrate includes a coefficient of thermal expansion (CTE) between 15 and 25 ppm, and a flexural modulus between 15 and 30 GPa.

6. The assembly of claim 1, wherein a layout of the second plurality of planar contact pads of the stiffener matches a layout of the inter-package contact pads of the first package.

7. The assembly of claim 1, wherein said plug material disposed between the first plurality and the second plurality of contact pads.

8. The assembly of claim 2, wherein said plug material disposed in the substrate of the stiffener.

9. The semiconductor assembly of claim 1 wherein said insulative plug material comprises an epoxy.

10. The semiconductor assembly of claim 1 wherein said insulative plug material comprises a silica filled epoxy composite.

11. The semiconductor assembly of claim 1 wherein said insulative plug material comprises a solder resist material.

12. The semiconductor assembly of claim 9 wherein said insulative plug material is disposed between the first plurality of planar contact pads and the second plurality of planar contact pads.

13. The semiconductor assembly of claim 9 wherein said insulative plug material is disposed between a solder resist layer formed on the top side of the stiffener and a solder resist layer formed on the bottom side of the stiffener.

14. The semiconductor assembly of claim 1 wherein said second plurality of planar contact pads on the bottom side of the stiffener are electrically connected to the inter-package contact pads of the first semiconductor package with a solder.

15. A semiconductor assembly comprising:
a first semiconductor package having a plurality of inter-package contact pads on a top side and a plurality of second level interconnect (SLI) pads on a bottom side; and
a planar stiffener having a plurality of contact pads on a top side of the stiffener electrically connected to a second semiconductor package, and a second plurality of contact pads on a bottom side of the stiffener electrically connected to the inter-package contact pads on the first semiconductor package by a solder having a melt temperature and an adhesive on the bottom side of the stiffener which attaches the stiffener to the top side of the first semiconductor package, said adhesive having a glass transition temperature between 90° C.-180° C. and a cure temperature below said melt temperature.

16. The assembly of claim 15 wherein the second plurality of contact pads on the stiffener is connected to the first package by a plurality of conductive microballs comprising said solder.

17. The assembly of claim 15 wherein the stiffener includes a substrate having a coefficient of thermal expansion (CTE) between 15 and 25 ppm, and a flexural modulus between 15 and 30 CPa.

18. The semiconductor assembly of claim 15 wherein the stiffener includes a solder resist layer and wherein the adhesive is attached to the solder resist layer.

* * * * *

UNITED STATES PATENT AND TRADEMARK OFFICE
CERTIFICATE OF CORRECTION

PATENT NO. : 8,513,792 B2  
APPLICATION NO. : 12/384984  
DATED : August 20, 2013  
INVENTOR(S) : Sank Ganesan et al.

Page 1 of 1

It is certified that error appears in the above-identified patent and that said Letters Patent is hereby corrected as shown below:

In the claims:

In column 6, line 49, in claim 17, delete "CPa." and insert -- GPa. --, therefor.

Signed and Sealed this
Twenty-second Day of October, 2013

Teresa Stanek Rea
*Deputy Director of the United States Patent and Trademark Office*